(12) United States Patent
Sukumaran et al.

(10) Patent No.: US 9,805,977 B1
(45) Date of Patent: Oct. 31, 2017

(54) INTEGRATED CIRCUIT STRUCTURE HAVING THROUGH-SILICON VIA AND METHOD OF FORMING SAME

(71) Applicant: GLOBALFOUNDRIES INC., Grand Cayman (KY)

(72) Inventors: Vijay Sukumaran, San Jose, CA (US); Thuy L. Tran-Quinn, Katonah, NY (US); Jorge A. Lubguban, Danbury, CT (US); John J. Garant, Poughkeepsie, NY (US)

(73) Assignee: GLOBALFOUNDRIES INC., Grand Cayman, KY (US)

( * ) Notice: Subject to any disclaimer, the term of this patent is extended or adjusted under 35 U.S.C. 154(b) by 0 days.

(21) Appl. No.: 15/176,598

(22) Filed: Jun. 8, 2016

(51) Int. Cl.
| | |
|---|---|
| *H01L 29/40* | (2006.01) |
| *H01L 21/768* | (2006.01) |
| *H01L 23/48* | (2006.01) |
| *H01L 21/306* | (2006.01) |
| *H01L 21/3065* | (2006.01) |
| *H01L 21/308* | (2006.01) |
| *H01L 21/321* | (2006.01) |

(52) U.S. Cl.
CPC .... *H01L 21/76898* (2013.01); *H01L 21/3065* (2013.01); *H01L 21/3083* (2013.01); *H01L 21/30604* (2013.01); *H01L 21/32115* (2013.01); *H01L 21/76802* (2013.01); *H01L 21/76831* (2013.01); *H01L 21/76843* (2013.01); *H01L 21/76873* (2013.01); *H01L 23/481* (2013.01)

(58) Field of Classification Search
USPC .................. 257/621, 774, 737; 438/667, 459
See application file for complete search history.

(56) References Cited

U.S. PATENT DOCUMENTS

| | | | |
|---|---|---|---|
| 8,264,077 | B2 | 9/2012 | Chiou et al. |
| 8,970,011 | B2 | 3/2015 | Farooq et al. |
| 9,432,298 | B1* | 8/2016 | Smith ................. H04L 49/9057 |
| 2013/0140709 | A1* | 6/2013 | Matsuura ............. H01L 23/481 257/774 |

(Continued)

OTHER PUBLICATIONS

Huang et al., "Integration Challenges of TSV Backside Via Reveal Process," IEEE, Electronic Components & Technology Conference, pp. 915-917 (2013).

(Continued)

*Primary Examiner* — Tram H Nguyen
(74) *Attorney, Agent, or Firm* — Michael Le Strange; Hoffman Warnick LLC

(57) ABSTRACT

One aspect of the disclosure relates to an integrated circuit structure. The integrated circuit structure may include a front side and back side opposing the front side, the integrated circuit structure comprising: a through-silicon-via (TSV) at least partially within a dielectric layer extending away from the front side; a first metal adjacent to the TSV and within the dielectric layer, the first metal being substantially surrounded by a first seed layer; a conductive pad over the first metal and the TSV and extending away from the front side, wherein the conductive pad provides electrical connection between the TSV and the first metal and includes a second seed layer substantially surrounding a second metal, wherein the second seed layer separates the second metal from the first metal and the TSV.

20 Claims, 10 Drawing Sheets

(56) References Cited

U.S. PATENT DOCUMENTS

2014/0035109 A1* 2/2014 Volant .................. H01L 23/481
257/621

OTHER PUBLICATIONS

Mauer et al., "Wet Silicon Etch Process for TSV Reveal," IEEE, Electronic Components & Technology Conference, pp. 878-882 (2014).
Rhoades et al., "Advances in CMP for TSV Reveal," ICPT. pp. 199-202 (2012).
Wang et al., "A Cost Effective Method for TSV Backside Reveal," IEEE, Electronics System-Integration Conference, 3 pages (2014).
Wang et al., "Si dry etching for TSV formation and backside reveal," IEEE, Electronics System-Integration Conference, 3 pages (2014).
Wantanabe et al., "Development of Cu-less TSV Reveal Process Using Si/Cu Grinding, Electroless Ni Plating, and Alkaline Etching of Si," IEEE, 15th Electronics Packaging Technology Conference, pp. 702-705 (2013).
Xue et al., "The Study of Backside TSV Reveal Process by direct Si/Cu Grinding and Polishing," IEEE, 15th Electronics Packaging Technology Conference, pp. 775-779 (2013)/.

* cited by examiner

INTEGRATED CIRCUIT STRUCTURE HAVING THROUGH-SILICON VIA AND METHOD OF FORMING SAME

BACKGROUND

Technical Field

The present disclosure relates to an integrated circuit structure, and more particularly, to an integrated circuit structure having a through-silicon-via (TSV) and method of forming the same.

Related Art

TSVs are generally vertical connections etched through a silicon wafer and filled with metal. With TSVs, two or more vertically stacked chips (or dies) can be joined by vertical interconnects running through the stack and functioning as components of an integrated circuit. Stacking chips in comparison to wire bonding, reduces inductive losses which increases speed of data exchange. Since TSVs have shorter interconnects between the dies, there will be reduced power consumption caused by long horizontal wiring. As a result, TSVs allow much higher input/output density than wire bonding, which consumes much more space.

In this manner, TSVs allow multiple integrated circuit chips to be stacked together, allowing greater amounts of information to be passed between the chips. For example, integrated circuit chips and memory devices which typically reside side-by-side on a silicon wafer, can be stacked on top of one another using the TSVs. Stacking the integrated circuit chips with the memory devices dramatically reduces the size of the overall chip package and boost speeds at which data flows among the functions on the chip.

After formation of TSVs in a silicon wafer, a back side grind operation is typically performed on the back side of the wafer to reveal the TSVs. As integrated circuits continue to be scaled down in size, TSVs have also reduced in size. During this back side grind, small TSVs (for example, less than or equal to approximately 10.0 μm) have a tendency to break off or become damaged. This results in higher leakage of electrical signals passing through the TSVs and significant yield loss. Further, current methods of revealing TSVs result in smearing of the metal from the TSV into the surrounding silicon wafer thereby contaminating the surface of the silicon wafer.

SUMMARY

A first aspect of the disclosure provides for a method of forming an integrated circuit structure. The method may include removing a portion of a wafer to expose a through-silicon-via (TSV) on a back side of the wafer; forming a first passivation layer over the exposed TSV and over the back side of the wafer; forming a first dielectric layer over the first passivation layer over the back side of the wafer, the first dielectric layer including a first opening that exposes a first portion of the first passivation layer over the TSV and a second portion of the first passivation layer in an area adjacent to the TSV; forming a first seed layer over the back side of the wafer and within the first opening over the exposed first and second portions of the first passivation layer; forming a first metal over the back side of the wafer and within the first opening over the first seed layer; planarizing the first metal, the first passivation layer, and the TSV to a top surface of the first dielectric layer and to expose a second metal of the TSV; and forming a conductive pad over the first metal and the TSV such that the conductive pad provides electrical connection between the second metal of the TSV and the first metal.

A second aspect of the disclosure provides for a method of forming and integrated circuit structure. The method may include removing a portion of a wafer to expose a through-silicon-via (TSV) on a back side of the wafer; forming a first passivation layer over the exposed TSV and over the back side of the wafer; forming a first dielectric layer over the first passivation layer over the back side of the wafer, the first dielectric layer including a first opening that exposes a first portion of the first passivation layer over the TSV and a second portion of the first passivation layer in an area adjacent to the TSV; forming a first seed layer over the back side of the wafer and within the first opening over the exposed first and second portions of the first passivation layer; forming a first metal over the back side of the wafer and within the first opening over the first seed layer; planarizing the first metal, the first passivation layer, and the TSV to a top surface of the first dielectric layer and to expose a second metal of the TSV; and forming a conductive pad over the first metal and the TSV such that the conductive pad provides electrical connection between the second metal of the TSV and the first metal, the conductive pad including a second seed layer and a third metal, wherein the second seed layer is distinct from the first seed layer.

A third aspect of the disclosure provides for an integrated circuit structure. The integrated circuit structure may include a front side and back side opposing the front side, the integrated circuit structure comprising: a through-silicon-via (TSV) at least partially within a dielectric layer extending away from the front side; a first metal adjacent to the TSV and within the dielectric layer, the first metal being substantially surrounded by a first seed layer; a conductive pad over the first metal and the TSV and extending away from the front side, wherein the conductive pad provides electrical connection between the TSV and the first metal and includes a second seed layer substantially surrounding a second metal, wherein the second seed layer separates the second metal from the first metal and the TSV.

BRIEF DESCRIPTION OF THE DRAWINGS

These and other features of this disclosure will be more readily understood from the following detailed description of the various aspects of the invention taken in conjunction with the accompanying drawings that depict various embodiments of the disclosure, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

The present disclosure relates to an integrated circuit structure, and more particularly, to an integrated circuit structure having a through-silicon-via (TSV) and method of forming the same.

After formation of TSVs in a silicon wafer, a back side grind operation is typically performed on the back side of the wafer to reveal the TSVs. As integrated circuits continue to be scaled down in size, TSVs also have become reduced in size. During the back side grind, small TSVs (for example, less than or equal to approximately 10 micrometers (μm)) have a tendency to break off or become damaged. This results in higher leakage of electrical signals passing through the TSVs and significant yield loss. Further, current methods of TSV reveal result in smearing of the metal from the TSV into the surrounding silicon wafer thereby contaminating the surface of the silicon wafer.

Aspects of the present disclosure provide for replacing much of the wafer from around a TSV with a dielectric layer. This prevents contamination of the wafer from TSV metal smearing. Additionally, the present disclosure provides for metal being formed within the dielectric layer adjacent to the TSV to provide additional support to the TSV during the back side grind such that the TSV is "anchored" and more robust. This prevents unwanted breakage or damage that may be conventionally caused by the back side grind. Therefore, the integrated circuit structure described herein provides for more robust interconnection to the TSV on the grind side, e.g., back side, thereby increasing the interconnect yield in the wafer.

Figure 1:
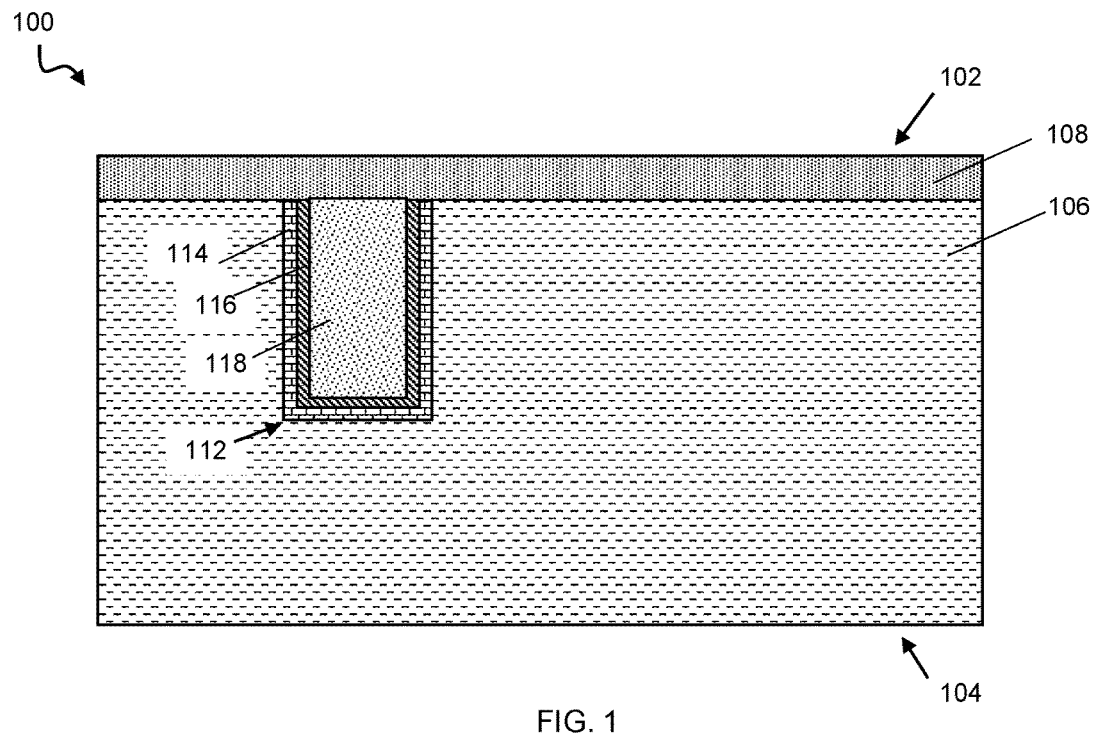
FIGS. 1-13 show a preliminary wafer undergoing aspects of a method according to embodiments of the disclosure with FIG. 13 showing a resulting integrated circuit structure.

FIG. 1 shows a wafer 100. Wafer 100 may include a front side 102 and a back side 104 opposing front side 102. Wafer 100 may include a substrate 106 extending toward back side 104 of wafer 100 and an active semiconductor region 108 extending from substrate 106 toward front side 102 of wafer. Substrate may include a thickness of approximately 500 μm to approximately 900 μm, or more particularly, 700 μm. As used herein "approximately" is intended to include values, for example, within 10% of the stated values. Substrate 106 may be a bulk silicon substrate (shown) or a semiconductor-on-insulator (SOI) substrate (not shown). As known in the art, SOI technology typically refers to the use of a layered semiconductor-insulator-semiconductor substrate in place of a more conventional bulk silicon substrate (bulk substrate) in semiconductor manufacturing, especially microelectronics. SOI-based devices differ from conventional silicon-built devices in that the silicon junction is above an electrical insulator, typically silicon dioxide or (less commonly) sapphire. The choice of insulator depends largely on intended application, with sapphire being used for radiation-sensitive applications and silicon oxide preferred for improved performance and diminished short channel effects in microelectronics devices. The precise thickness of the insulating layer and topmost silicon layer also vary widely with the intended application. Substrate 106 and/or semiconductor layers of an SOI substrate may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate 106 may be strained.

Active semiconductor region 108 may be formed over substrate 106 extending toward front side 102 of wafer 100. It will be understood that when an element as a layer, region or substrate is referred as being "on" or "over" another element, it can be directly on the other element or intervening elements may be present unless otherwise stated. It will also be understood that when an element is referred to as being "connected" or "coupled" to another element, it can be directly connected or couple to the other element or intervening elements may be present. Active semiconductor region 108 may include a plurality of layers (not shown) having a plurality of active devices (not shown), e.g., transistors, resistors, capacitors, etc., as known in the art.

Wafer 100 may also include a through-silicon-via (TSV) 112. TSV 112 may include a liner layer 114, a seed layer 116, and a metal 118. Liner layer 114 may include, for example, an oxide, such as silicon dioxide, a nitride, such as silicon nitride, or any other dielectric materials discussed herein. Seed layer 116 may include, for example, at least one of: tantalum nitride, copper, titanium, tungsten, titanium nitride, titanium tungsten, titanium copper, titanium tungsten copper, tantalum, combinations thereof, or other electrically conductive materials. Metal 118 may include, for example, at least one of: copper, tungsten, tantalum, or titanium. TSV 112 according to embodiments of the disclosure described herein may have a height of approximately 10 μm to approximately 120 μm, or more particularly 55 μm. The TSV 112 may have a cross-sectional width, or diameter, of approximately 10 μm. However, it is to be understood that embodiments of the disclosure may be equally applicable to TSV's having heights greater than 120 μm TSV 112 and for diameters less than 10 μm (e.g., 5 μm or less) may be formed either prior to the formation of active semiconductor region 108 or at a desired time during the formation of active semiconductor region 108. As shown, TSV 112 may extend from active semiconductor region 108. In this embodiment, TSV 112 may be formed prior to the formation of semiconductor active region 108. In such an embodiment, TSV 112 may be formed by providing a photoresist (not shown) over substrate 106. The photoresist may be patterned and etched to expose substrate 106 at a location desired for TSV 112. The exposed substrate 106 may then be etched to form an opening (not shown). Subsequently, liner layer 114 may be formed, e.g., deposited, within the opening to line or coat the opening. In some embodiments, a Bosch etch may be used to form the opening. During the Bosch etch, the etching of opening and deposition of liner layer 114 may be alternated such that the opening is formed with liner layer 114 coating or lining it. Seed layer 116 may then be formed, e.g., deposited, within the opening to line or coat liner layer 114. Metal 118 may be formed, e.g., deposited or electroplated, within the opening to substantially fill the opening. As used herein, "substantially" refers to largely, for the most part, entirely specified or any slight deviation which provides the same technical benefits of the invention. Lastly, any liner layer 114, seed layer 116, or metal 118 outside of the opening may be planarized to a top surface of substrate 106. However, in another embodiment (not shown), TSV 112 may be formed at a desired time during the formation of semiconductor active region 108. In such an embodiment, TSV 112 may extend at least partially within semiconductor active layer 108. TSV 112 may be formed in substantially the same way as described with respect to TSV formation prior to formation of active semiconductor region 108. That is, TSV 112 formation according to this embodiment may include patterning and etching a photoresist, etching an opening in active semiconductor region 108 and substrate 106, and forming liner layer 114, seed layer 116, and metal 118 therein.

As used herein, "depositing" may include any now known or later developed techniques appropriate for the material to be deposited including but are not limited to, for example: chemical vapor deposition (CVD), low-pressure CVD (LP-CVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

"Etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as shallow trench isolation (STI) trenches.

Planarization refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This removes material and tends to even out any "topography," making the wafer flat and planar.

Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

Figure 2:
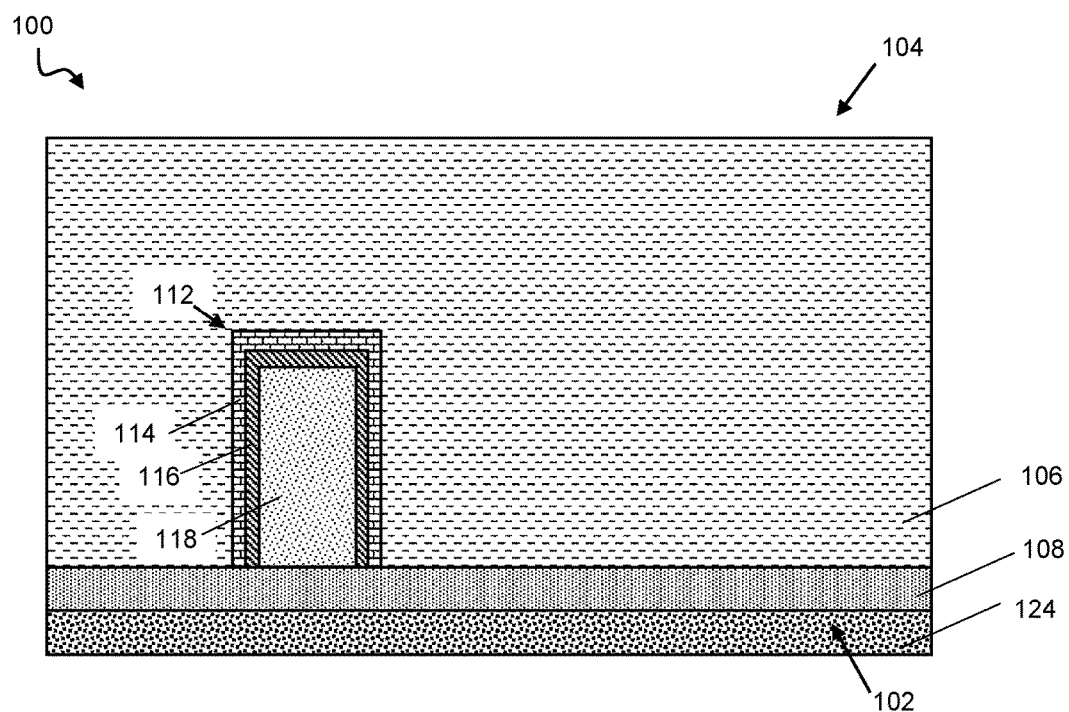

FIG. 2 shows wafer 100 flipped over. As shown in FIG. 2, a handle wafer 124 may be formed extending from semiconductor active region 108 toward front side 102 of wafer 100. Handle wafer 124 may be bonded to wafer 100 using standard processes, such as temporary adhesive bonding. As known in the art, handle wafer 124 may include, for example, bulk silicon or glass. Handle wafer 124 provides mechanical support to wafer 100 such that wafer 100 may be manipulated to undergo additional processing. Wafer 100 may be flipped or turned over such that back side 104 of wafer 100 can undergo additional processing.

Figure 3:
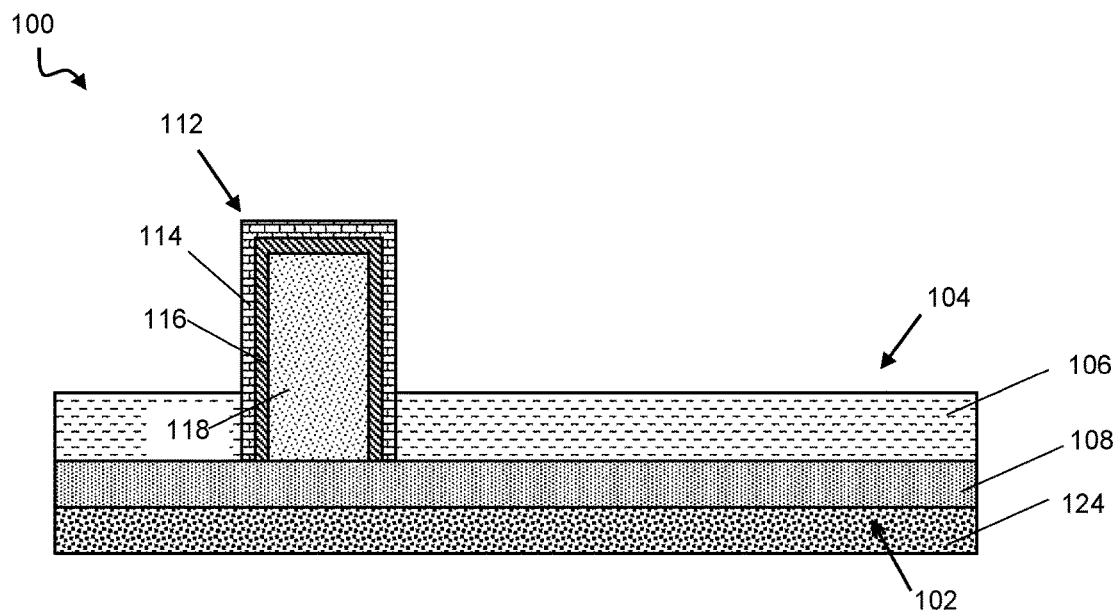

As shown in FIG. 3, a portion of wafer 100 may be removed to expose TSV 112 on back side 104 of wafer 100. More specifically, a portion of substrate 106 may be removed to expose TSV 112. In some embodiments, this removal process may first include an optional thinning process. The thinning process may thin substrate 106, for example, from its approximately 700 μm thickness to a thickness of approximately 60 μm to approximately 70 μm. The thinning process may be performed by polishing, for example, by CMP. Subsequently, a second etch may be performed to expose TSV 112. This second etch may include, for example, RIE. Specifically, this RIE etch removes portions of substrate 106 without affecting or harming TSV 112. That is, this etching process only removes exposed semiconductor materials. Since liner layer 114 is an insulator and substantially surrounds TSV 112, liner layer 114 protects TSV 112 from being etched during the RIE.

Substrate 106 may be etched such that a substantial portion of TSV 112 is exposed. However, it is to be understood that substrate 106 may be etched to any desirable depth depending on the application of TSV 112 without departing from aspects of the invention. In some embodiments, it may be desirable to etch substrate 106 to expose semiconductor active region 108, such as where substrate 106 is a bulk substrate. In other embodiments, where substrate 106 is an SOI substrate, substrate 106 may be etched to the insulator layer of the SOI substrate. In any of the embodiments, however, etching should be stopped before any damage occurs to any active devices, for example, in semiconductor active region 108.

Figure 4:
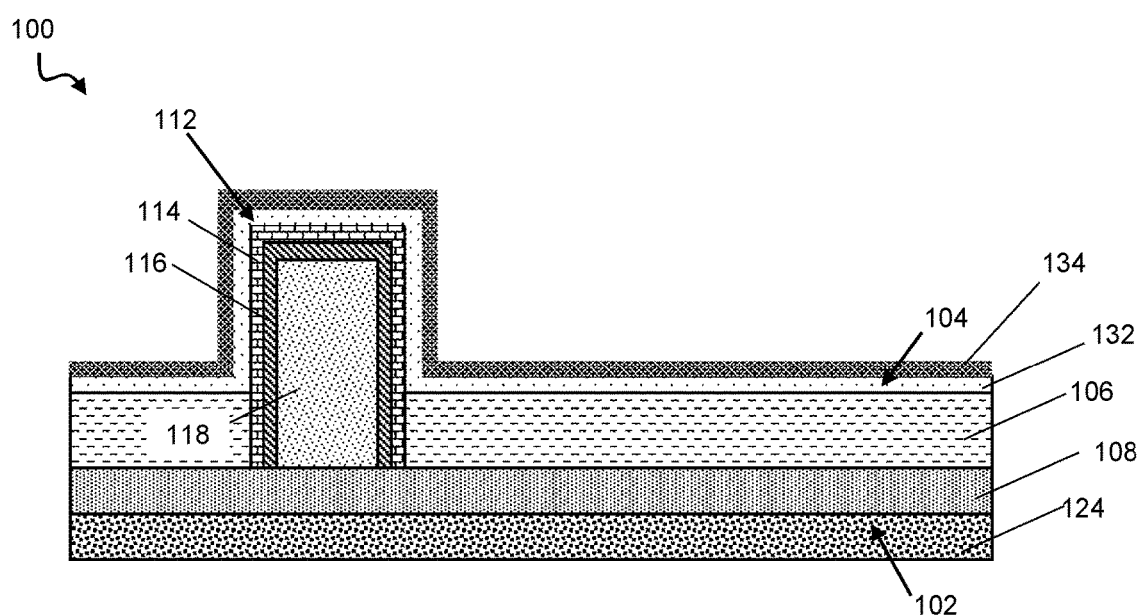

As shown in FIG. 4, a passivation layer 132 may be formed over wafer 100 including the exposed TSV 112 on back side 104 of wafer 100. That is, passivation layer 132 may be formed by deposition, e.g., PECVD. As shown, passivation layer 132 is formed over liner layer 114 of TSV 112 and over the etched back substrate 106. Passivation layer 132 may include an oxide, e.g., silicon dioxide. Further, another passivation layer 134 may be formed over passivation layer 132 on back side 104 of wafer 100. Passivation layer 134 may be formed via deposition, e.g., PECVD. Passivation layer 134 may include a nitride, e.g., silicon nitride.

Figure 5:
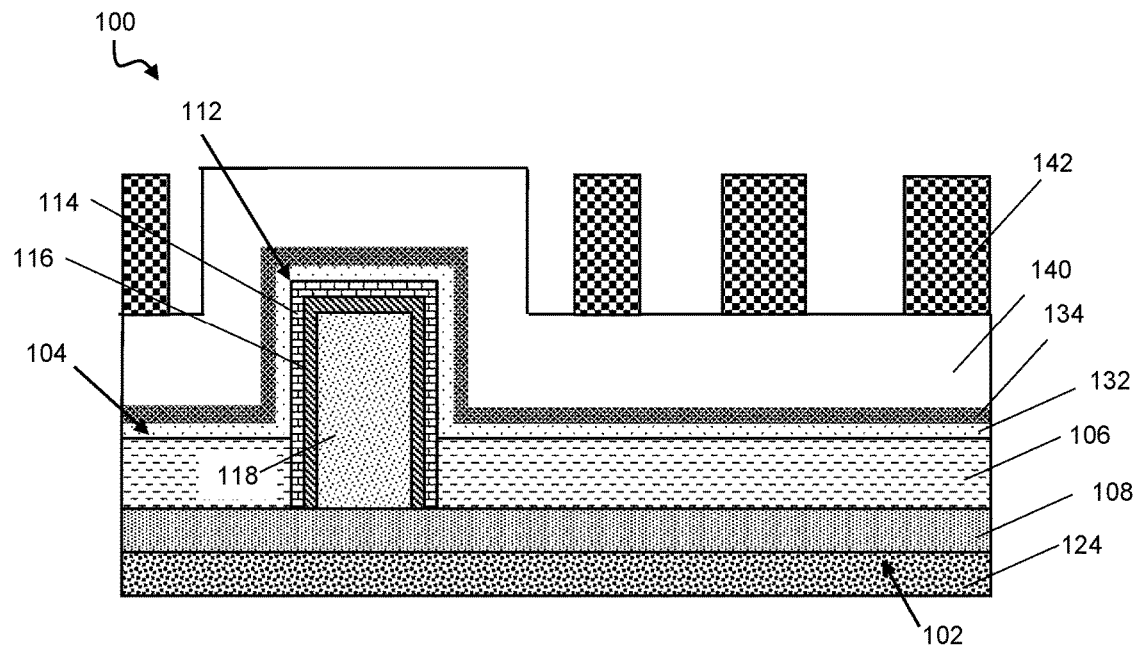

Referring now to FIG. 5, a dielectric layer 140 may be formed on back side 104 of wafer 100 over passivation layer 134. Dielectric layer 140 may include silicon nitride ($Si_3N_4$), silicon oxide ($SiO_2$), fluorinated SiO2 (FSG), hydrogenated silicon oxycarbide (SiCOH), porous SiCOH, boro-phosphosilicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. In other embodiments, dielectric layer 140 may include any material that may be photodefinable. Dielectric layer 140 may have a thickness of approximately 2.0 μm to 5.0 μm, or more particularly 3.0 μm.

Still referring to FIG. 5, a photoresist 142 may be formed over dielectric layer 140 on back side 104 of wafer 100. Photoresist is often used as a masking material in photolithographic processes to reproduce either a positive or a negative image on a structure, prior to etching (removal of material which is not masked). In some embodiments, photoresists may include a photoresist stack including, for example, an organic planarization layer, an anti-reflective coating layer, and a photoresist layer as is known in the art. Photoresist 142 may be patterned and etched to expose portions of dielectric layer 140 thereunder.

Figure 6:
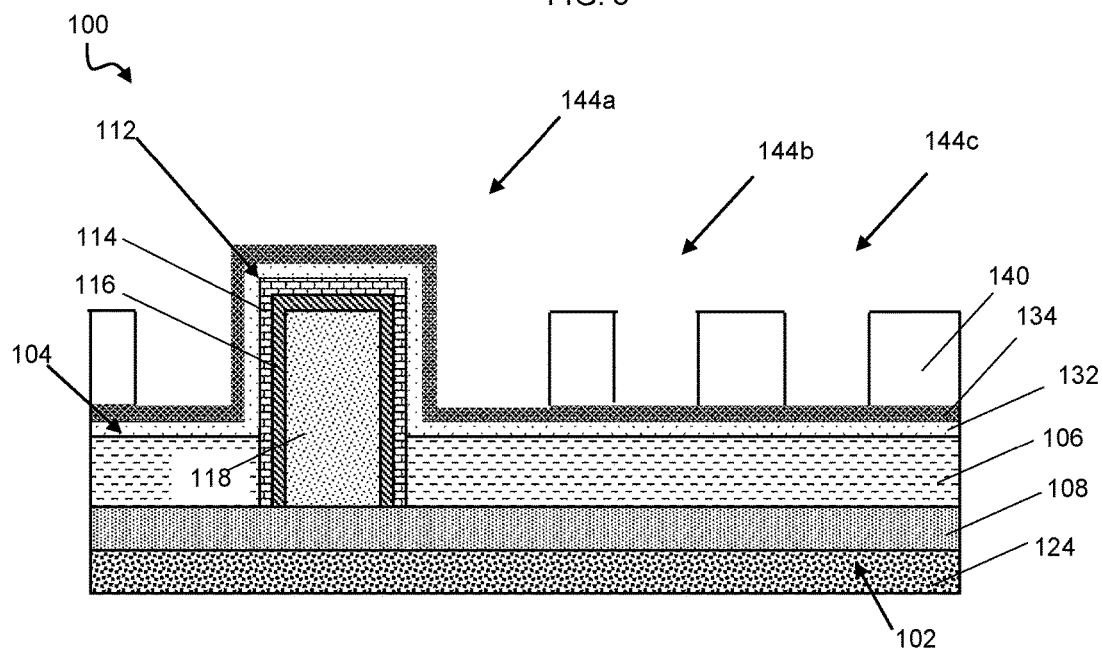

As shown in FIG. 6, the exposed portions of dielectric layer 140 may be removed, e.g., via etching, to create openings 144a, 144b, 144c to expose passivation layer 134 thereunder. As shown, opening 144a exposes passivation layer 134 over TSV 112 and passivation layer 134 within areas adjacent to TSV 112, e.g., the areas on opposing sides of the cross-section of TSV 112 shown in FIG. 6. Openings 144b, 144c expose portions of passivation layer 134 at other locations over wafer 100. While only two other openings 144b, 114c are shown, it is to be understood that any number of openings may be included without departing from aspects of the disclosure. As will be described, the number of openings created may facilitate additional wiring and depend on the desired application of wafer 100. Further, photoresist 142 (FIG. 5) may be removed from wafer 100 as shown in FIG. 6.

Figure 7:
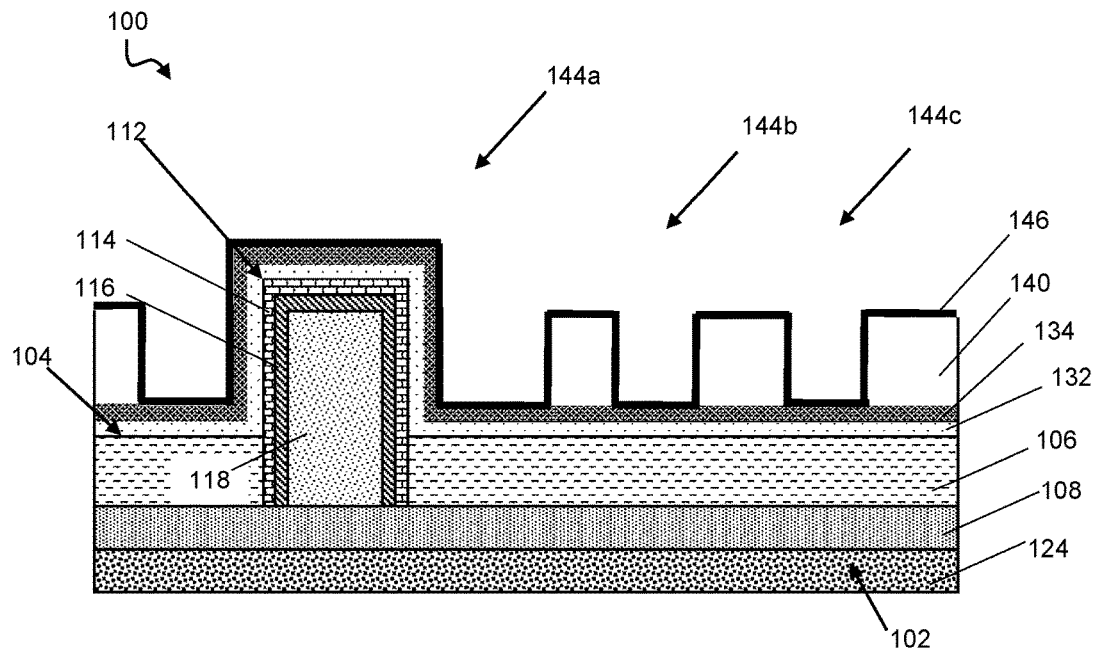

Referring now to FIG. 7, a seed layer 146 may be formed over dielectric layer 140 and exposed passivation layer 134 within openings 144a, 144b, 144c on back side 104 of wafer 100. Seed layer 146 may be formed, for example, by deposition. Seed layer 146 may include, for example, at least one of: tantalum nitride, copper, titanium, tungsten, titanium tungsten, titanium copper, titanium tungsten copper, tantalum, combinations thereof, or any other electrically conductive material. Seed layer 146 may include the same material as seed layer 116 or a material distinct from the material used for seed layer 116.

Figure 8:
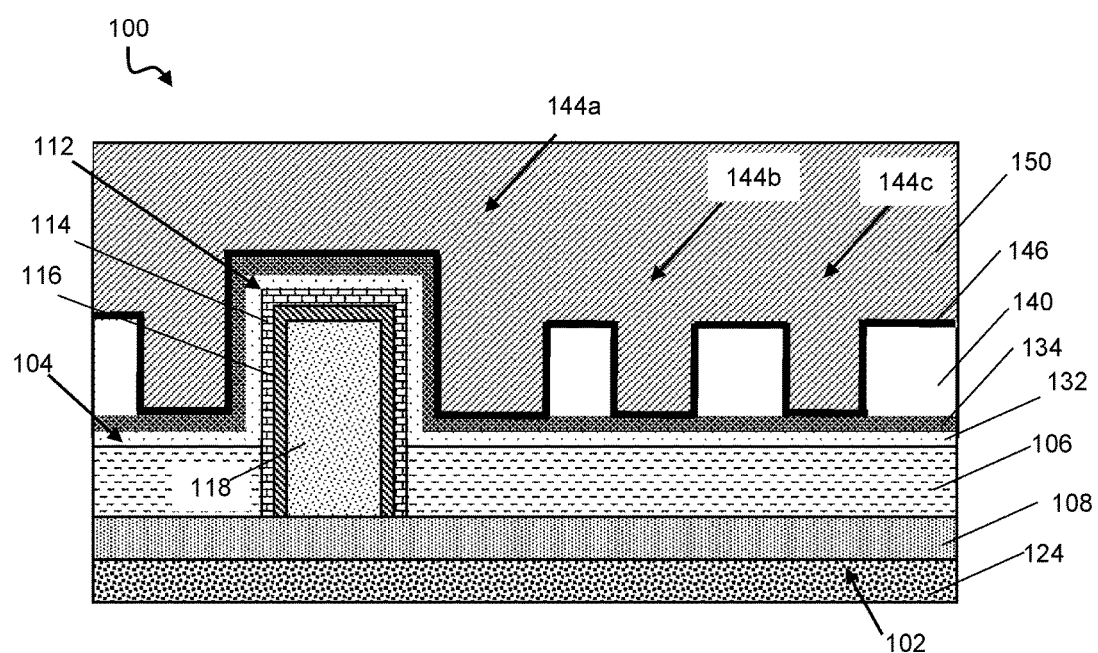
Figure 9:
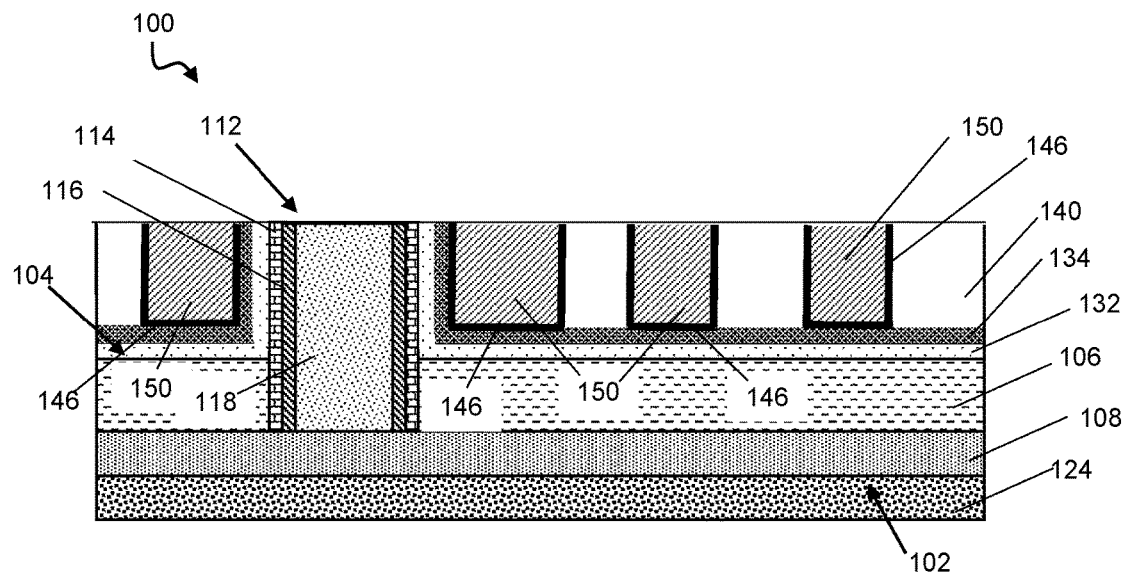

Referring now to FIG. 8, a metal 150 may be formed, for example, by electroplating. Metal 150 may include, for example, copper, tungsten, tantalum, or titanium, or any other metal having high conductivity (approximately 2.0 microOhms/cm or greater) and compatibility with adjacent materials and processing methods thereto. Metal 150 may be formed such that it covers seed layer 146 on back side 104 of wafer 100. That is, metal 150 may be formed over seed layer 146 over the remaining portions of dielectric layer 140 and over seed layer 146 within openings 144a, 144b, 144c to substantially fill openings 144a, 144b, 144c. As shown in FIG. 9, metal 150, seed layer 146, passivation layer 132, passivation layer 134, and TSV 112 (including liner layer 114, seed layer 116, metal layer 118) may be planarized to a top surface of dielectric layer 140.

During conventional processes, planarization of the TSV may result in unwanted damage to the TSV. Specifically, due to the small size of the TSVs, they may easily break or become damaged during planarization. In contrast to conventional integrated circuit structures having TSVs, the present disclosure provides for metal 150 adjacent to TSV 112 to provide additional strength to TSV 112 while wafer 100 is undergoing planarization. That is, methods and structures described herein result in a more robust integrated circuit structure that is capable of withstanding planarization without damage to TSV 112. Further, because substrate 106 has been substantially removed and replaced with dielectric layer 140, substrate 106 does not become contaminated from any potential metal smearing from metal 150 and/or metal 118.

Figure 10:
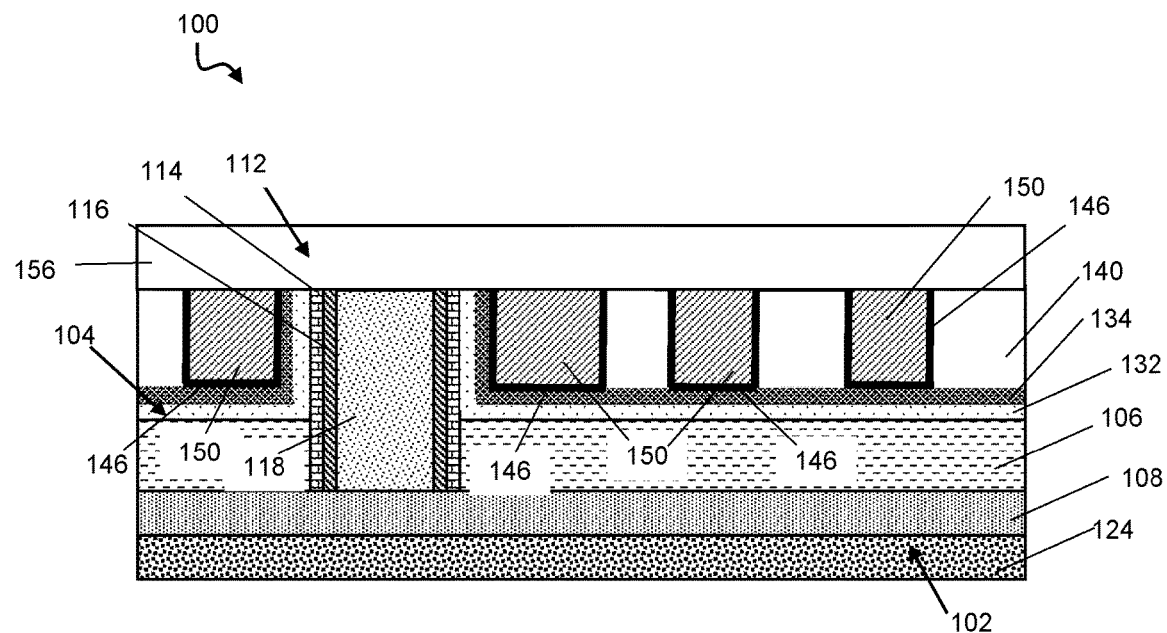
Figure 11:
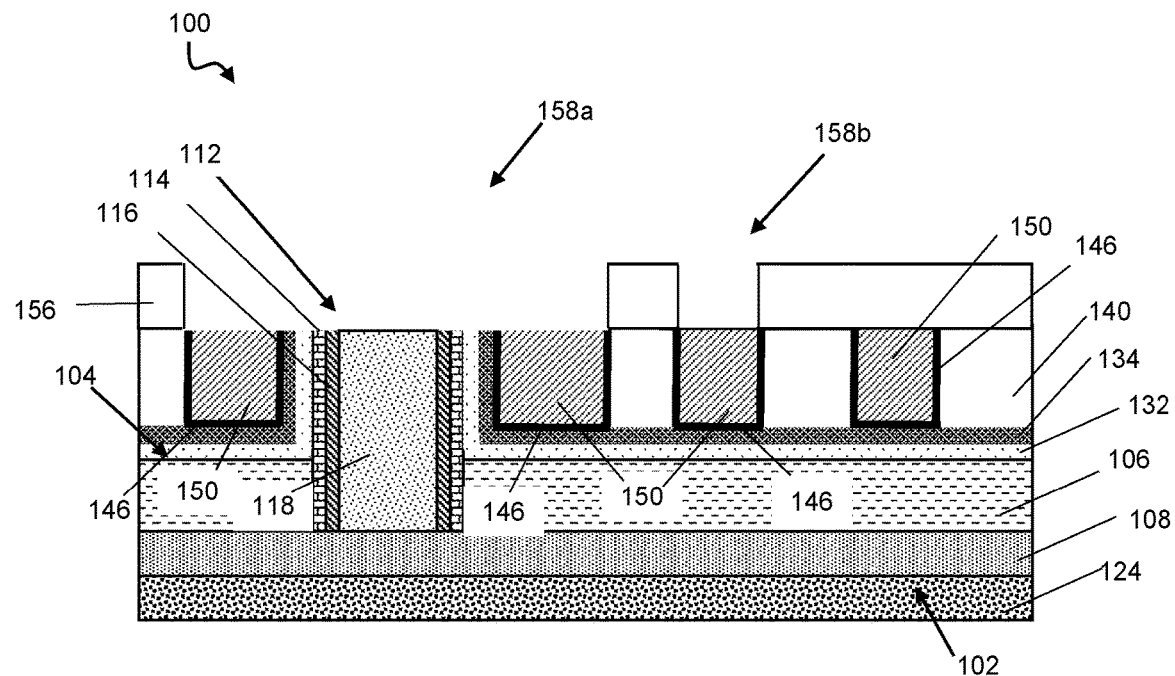

The method may continue by forming a conductive pad 160 (FIG. 13) over metal 150 and metal 118 such that electrical connection is provided between metal 150 and metal 118 of TSV as shown in FIGS. 10-13. To this end, as shown in FIG. 10, another dielectric layer 156 may be formed over back side 104 wafer 100. That is, dielectric layer 156 may be formed over dielectric layer 140, seed layer 146, passivation layer 134, passivation layer 132, and TSV 112 and extending away from front side 102 of wafer 100. Dielectric layer 156 may include any of the dielectric materials discussed relative to dielectric layer 140. Dielectric layer 156 may have a thickness of approximately 0.5 μm to approximately 2.0 μm, or more particularly, approximately 1.0 μm. Dielectric layer 156 may be patterned and etched as shown in FIG. 11 to form openings 158a, 158b. As shown, dielectric layer 156 is patterned and etched such that opening 158a exposes TSV 112. Additionally, opening 158a exposes the area adjacent to TSV 112 that includes metal 150, passivation layers 132, 134, and seed layer 146. Opening 158a facilitates the formation of a conductive pad that provides electrical connection between TSV 112 and metal 150 as will be described herein. Opening 158b is shown as exposing seed layer 146 and metal 150 that filled opening 144b (FIG. 8). However, it is to be understood that dielectric layer 156 may be etched in any desired orientation without departing from aspects of the disclosure. Therefore, more or less openings may be formed in dielectric layer 156 depending on the desired application of wafer 100. For example, an opening (not shown) may be formed to expose seed layer 146 and metal 150 that filled opening 144c (FIG. 8). However, in any embodiment, an opening, for example opening 158a, must be formed to expose both TSV 112 and metal 150 adjacent to TSV 112 in order to provide electrical connection between TSV 112 and metal 150.

Figure 12:
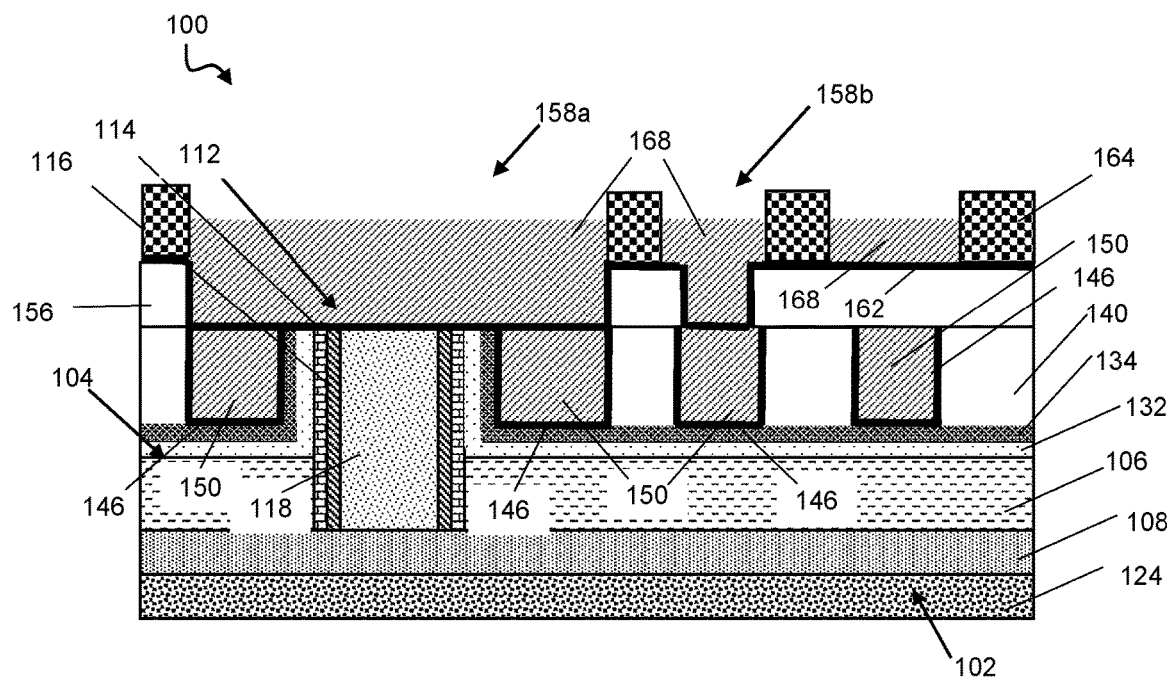

Referring now to FIG. 12, a seed layer 162 may be formed, e.g., conformally deposited, within openings 158a, 158b and within the field between openings 158a, 158b over dielectric layer 156. Seed layer 162 may include any of the materials listed relative to seed layer 146. In some embodiments, seed layer 162, while chosen from the materials discussed relative to seed layer 146, may be a material distinct from the material used for seed layer 146. Further, another photoresist 164 may be formed over seed layer 162, patterned and etched to expose portions of seed layer 162 thereunder. Photoresist 164 may be patterned and etched in any desired orientation other than that shown in FIG. 12 without departing from aspects of the disclosure. However, in any embodiment, photoresist 164 should be patterned and etched to expose seed layer 162 that is formed in opening 158a.

Figure 13:
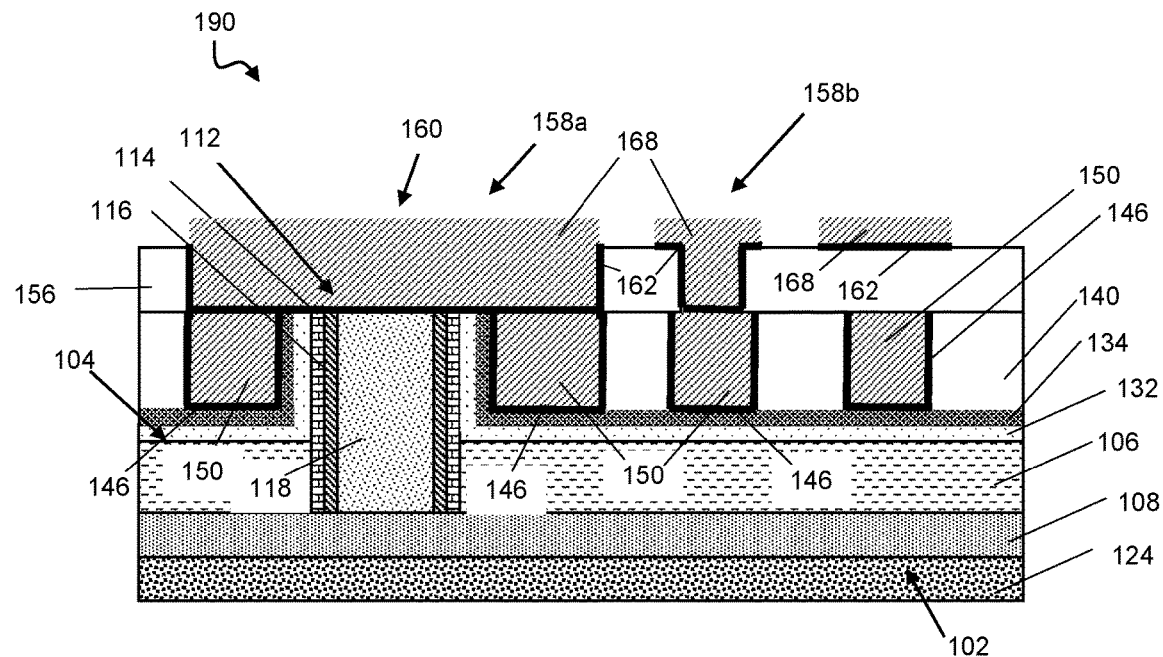

Still referring to FIG. 12, a metal 168 may be formed, e.g., electroplated, over exposed portions of seed layer 162. Metal 168 may include any of the materials discussed relative to metal 150. Metal 168 may be formed to substantially fill openings in 158a, 158b. Metal 168 may have a thickness of approximately 0.5 μm to approximately 4.0 μm, or more specifically approximately 3.0 μm. However, metal 168 may be electroplated to any desirable thickness without departing from aspects of the disclosure. As shown in FIG. 13, photoresist 164 may be removed leaving behind a conductive pad 160 in opening 158a. Additionally, an etching may be performed to remove the seed layer 162 not covered by metal 168 from the field, or an area over dielectric layer 156 between portions of metal 168. Such an etching process may include a wet etch.

Still referring to FIG. 13, a resulting integrated circuit structure 190 is shown. Integrated circuit structure 190 may include front side 102 and back side 104 opposing front side 102. As shown in the cross-section of FIG. 13, active device region 108 may be disposed on front side 102 of integrated circuit structure 190. Substrate 106 may be disposed over active device region 108 on back side 104 of integrated circuit structure 190. However, as discussed herein, substrate 106 is etched back, and in some embodiments, substrate 106 may be completed removed. Overlying substrate 106 over back side 104 of integrated circuit structure 190 may be passivation layer 132, and overlying passivation layer 132 may be passivation layer 134. Dielectric layer 140 may be disposed over passivation layer 134 over back side 104 of integrated circuit structure 190. TSV 112 may be disposed at least partially within dielectric layer 140 over back side 104 and extend away from front side 102. TSV 112 may include liner layer 112, seed layer 116, and metal 118. Passivation layers 132, 134 may substantially line sidewalls of TSV 112, or more specifically, liner layer 114 of TSV 112. Additionally, metal 150 may be disposed adjacent to TSV 112 within dielectric layer 140. As shown in the cross-section of FIG. 13, metal 150 may be formed on opposing sides of TSV 112 and may be substantially separated from TSV by passivation layers 132, 134. Metal 150 may be substantially surrounded by seed layer 146 within dielectric layer 140. Metal 150, passivation layers 132, 134, seed layer 146, and TSV 112 (including liner layer 114, seed layer 116, and metal 118) may each be planar with a top surface of dielectric layer 140.

Further, conductive pad 160 may be disposed over TSV 112 and metal 150 over back side 102 such that conductive pad 160 extends away from front side 102 of integrated circuit structure 190. Conductive pad 160 may include a portion of seed layer 162 and metal 168. Conductive pad 160 may be disposed within dielectric layer 156 which is disposed on back side 104 of integrated circuit structure 190 over dielectric layer 140. Conductive pad 160 provides electrical connection between TSV 112 and metal 150 adjacent to TSV 112.

Figure 14:
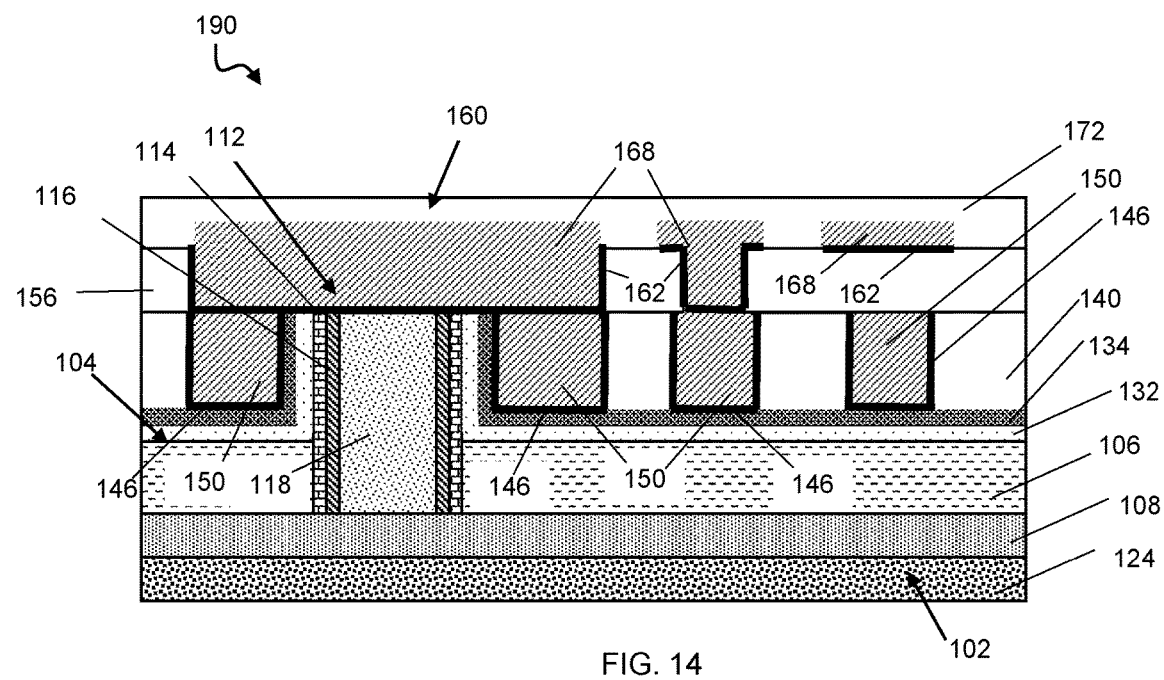
FIGS. 14-17 show the resulting integrated circuit structure of FIG. 13 undergoing additional processing steps to form additional wiring.
Figure 15:
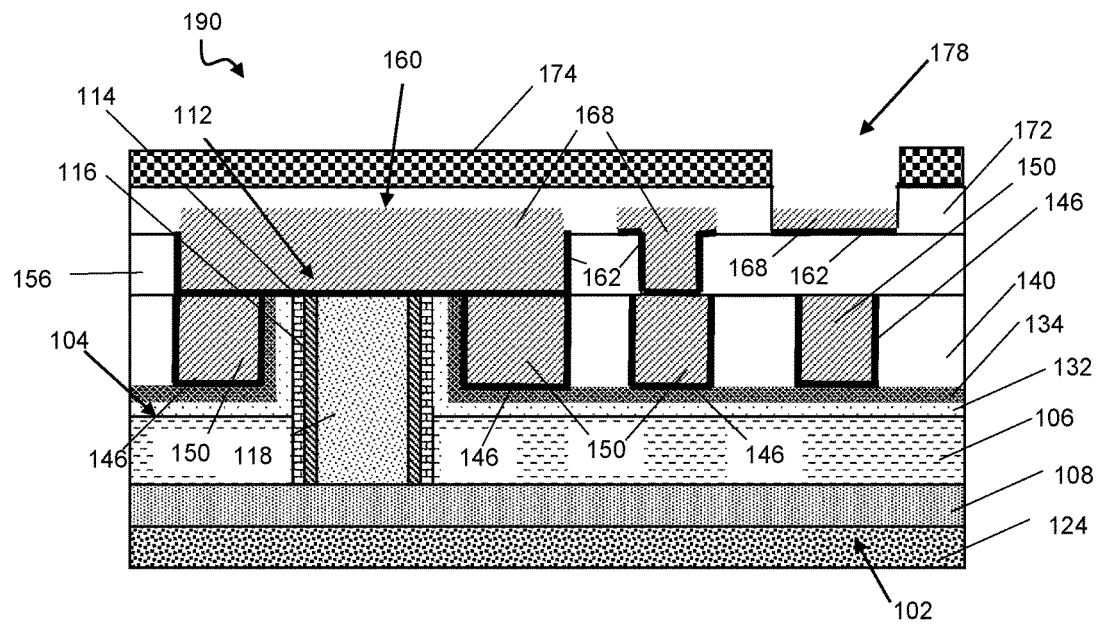
Figure 16:
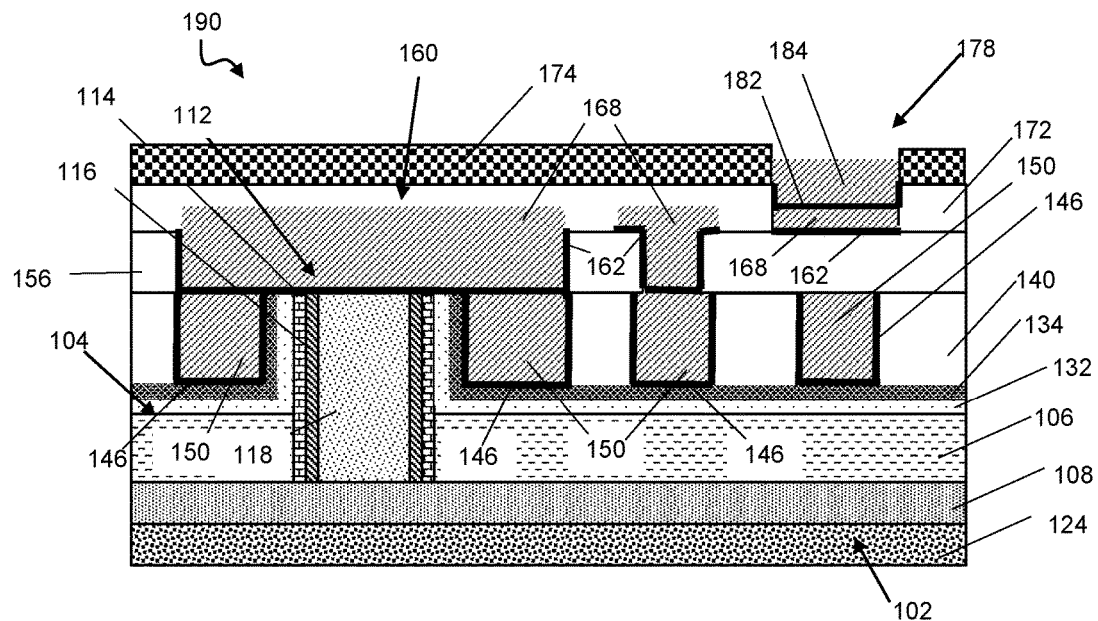
Figure 17:
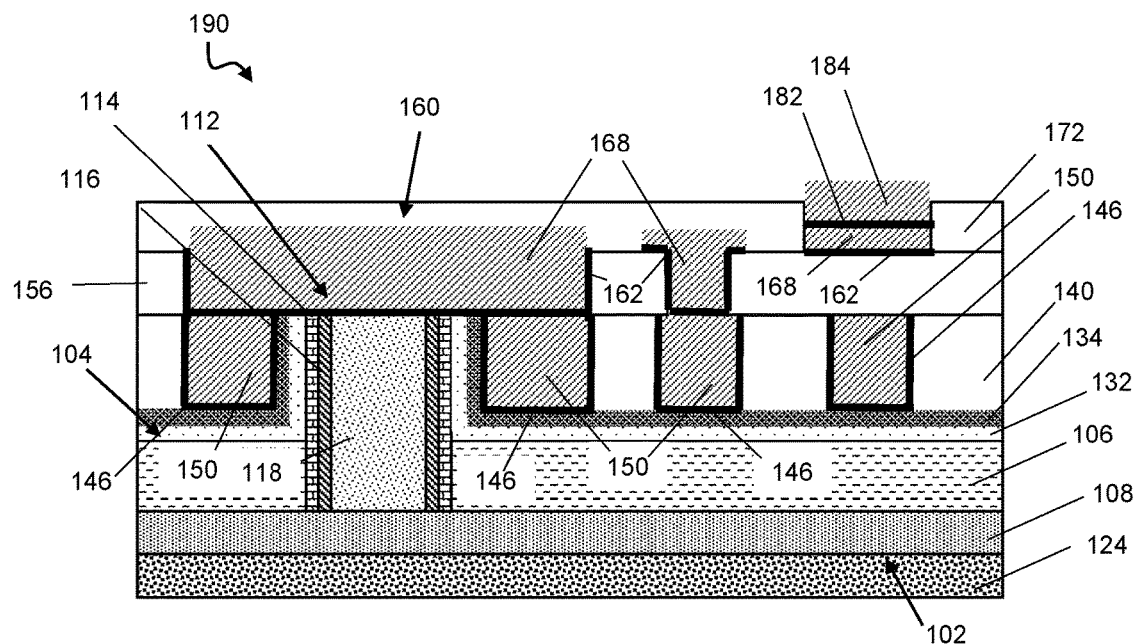

In some embodiments, it may be desirable to provide additional wiring and/or connections. In such embodiments, additional dielectric layers having additional wiring structures therein may be formed over integrated circuit structure 190. Referring now to FIG. 14, another dielectric layer 172 is formed, e.g., conformally deposited, over metal 168 and seed layer 162. Dielectric layer 172 may include any of the dielectric materials listed herein relative to dielectric layer 140. Dielectric layer 172 may include a thickness of approximately 0.5 µm to approximately 2.0 µm, or more particularly, approximately 1.0 µm. As shown in FIG. 15, another photoresist 174 may be formed over dielectric layer 172. Photoresist 164 may be patterned and etched in any desired orientation other than that shown in FIG. 15 without departing from aspects of the disclosure. Photoresist 174 may be patterned and etched to expose a portion of dielectric layer 172 thereunder. Further, dielectric layer 172 may be etched to create opening 178 to expose a portion of metal 168. As shown in FIG. 16, another seed layer 182 may be formed, e.g., deposited, within opening 178. Seed layer 182 may include any of the materials discussed relative to seed layer 146. Additionally, another metal 184 may be electroplated over seed layer 182. Metal 184 may include any of the metal materials discussed relative to metal 150. Additionally, as shown in FIG. 17, photoresist 174 (FIG. 16) may be removed. Further, any member of additional back-end-of-the-line (BEOL) processing layers may be formed.

Figure 18:
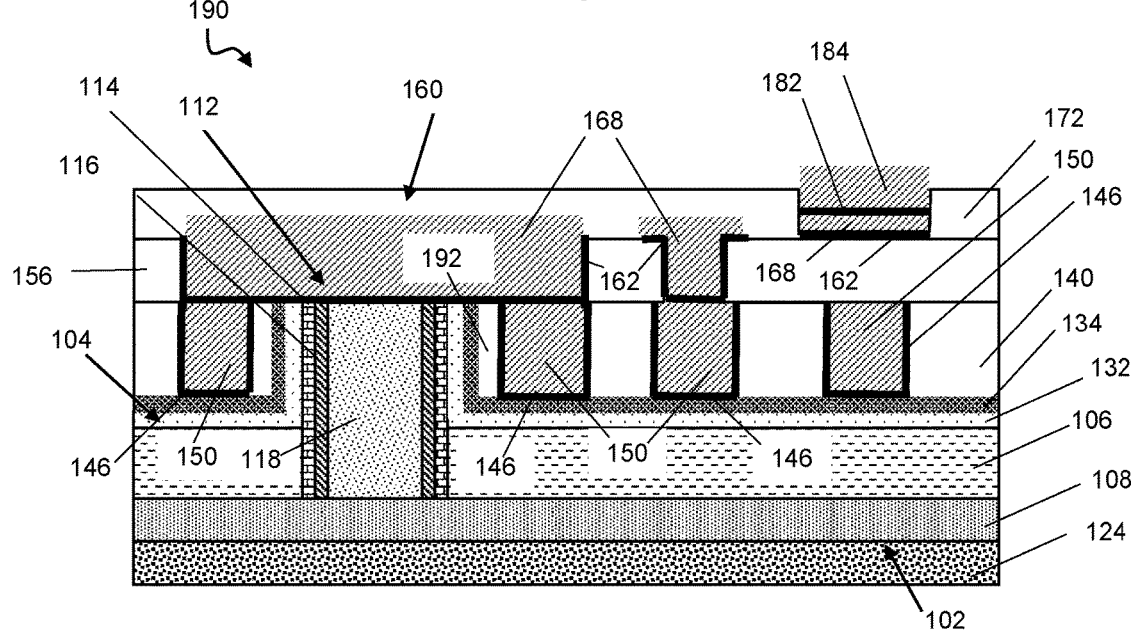
FIGS. 18-20 show alternative orientations of the resulting integrated circuit structure of FIG. 13.
Figure 19:
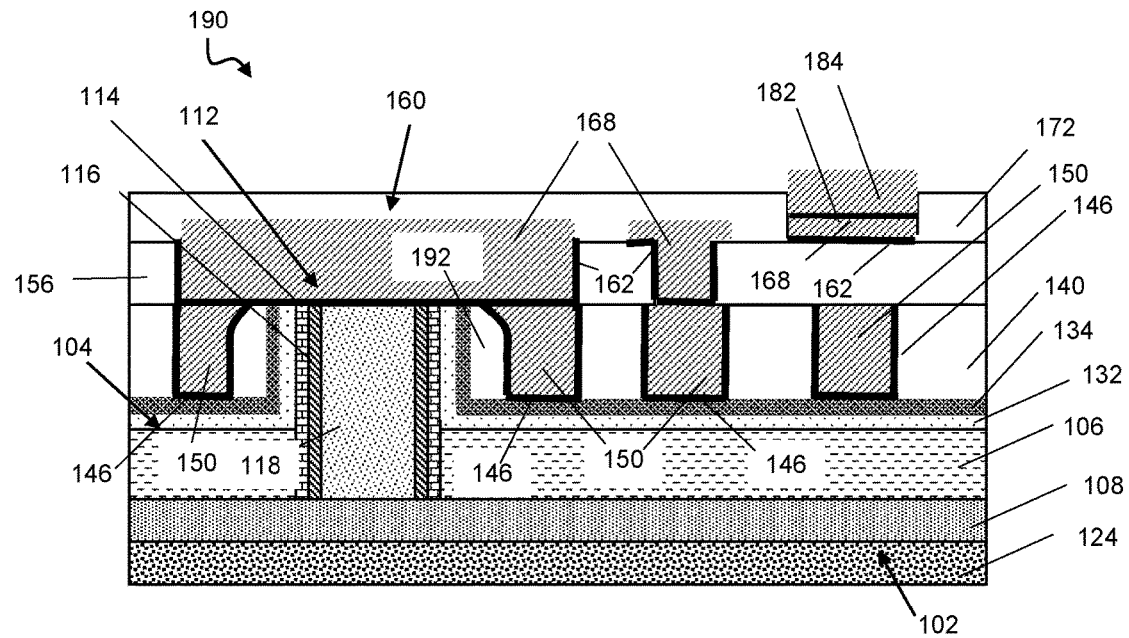
Figure 20:
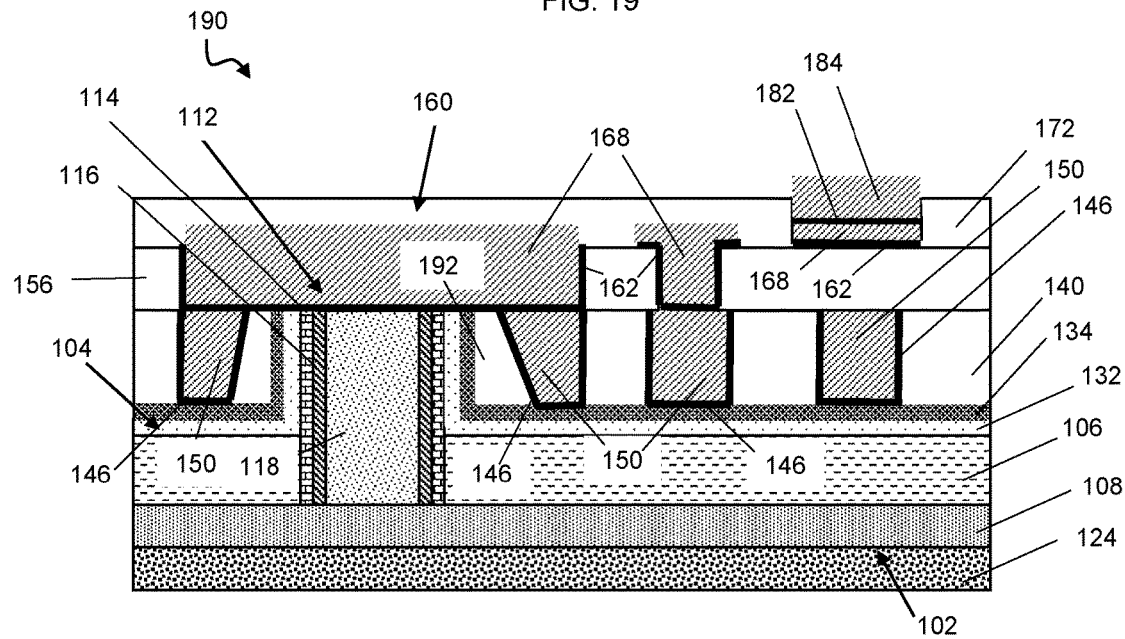

FIGS. 18-20 show alternative embodiments of the disclosure which may be used based on design choice and the intended application of IC structure 190. Specifically, FIGS. 18-20 show alternative orientations of the formation of seed layer 146 and metal 150 adjacent to TSV 112. As shown in FIG. 18, during the formation of opening 144a (FIG. 7), a portion of dielectric layer 140, e.g., portion 192, may remain between seed layer 146 and passivation layers 132, 134 surrounding TSV 112. That is, during the masking and etching as described with respect to FIGS. 5-6, portion 192 may remain between seed layer 146 and passivation layers 132, 134 surrounding TSV 112 at a location adjacent to TSV 112. Referring now to FIGS. 19-20, the shape of portion 192 between seed layer 146 and passivation layers 132, 134 surrounding TSV 112 may also be customized depending on desired application of integrated circuit structure 190. The shape of portion 192 may be determined by the masking patterns and etch conditions used to create opening 144a (FIG. 7). As shown in FIG. 19, seed layer 146 and metal 150 may be sloped on at least one side wall resulting in an arch shape for portion 192. As shown in FIG. 20, seed layer 146 and metal 150 may have a tapered shape resulting in a frustoconical shaped portion 192 of dielectric layer 140. The alternative embodiments shown in FIGS. 19-20 may be formed by a plasma etch. The shapes shown in FIGS. 19-20 can be formed by altering one or more of the following plasma etching conditions during the forming of opening 144a: gas flow rates and ratios, plasma power, bias power on substrate, and etch duration. Plasma etch can either be a physical phenomenon, wherein, material removal is based on ion bombardment; or it could be chemical in nature wherein the ions react with the substrate to cause material removal. In some cases the etching is a combination of physical and chemical reactions.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of forming an integrated circuit structure, the method comprising:
   removing a portion of a wafer to expose a through-silicon-via (TSV) on a back side of the wafer;
   forming a first passivation layer over the exposed TSV and over the back side of the wafer;
   forming a first dielectric layer over the first passivation layer over the back side of the wafer, the first dielectric layer including a first opening that exposes a first portion of the first passivation layer over the TSV and a second portion of the first passivation layer in an area adjacent to the TSV;
   forming a first seed layer over the back side of the wafer and within the first opening over the exposed first and second portions of the first passivation layer;
   forming a first metal over the back side of the wafer and within the first opening over the first seed layer;
   planarizing the first metal, the first passivation layer, and the TSV to a top surface of the first dielectric layer and to expose a second metal of the TSV; and
   forming a conductive pad over the first metal and the TSV such that the conductive pad provides electrical connection between the second metal of the TSV and the first metal.

2. The method of claim 1, wherein the forming of the conductive pad includes:
   forming a second dielectric layer over the first metal and the TSV over the back side of the wafer;
   patterning and etching the second dielectric layer to create a second opening that exposes the first metal and the second metal of the TSV;
   forming a second seed layer within the second opening over the exposed first metal and the exposed second metal of the TSV; and
   electroplating a third metal over the second seed layer within the second opening.

3. The method of claim 2, wherein the second seed layer is a material distinct from the first seed layer.

4. The method of claim 2, wherein the first seed layer and the second seed layer each include at least one of: titanium, titanium nitride, titanium tungsten, tantalum nitride, copper, tungsten, titanium copper, titanium tungsten copper, tantalum or combinations thereof.

5. The method of claim 2, wherein the first, second, and third metals each include at least one of: copper, tungsten, tantalum, or titanium.

6. The method of claim 1, wherein the forming the first passivation layer includes:
   forming an oxide layer and a nitride layer over the exposed TSV.

7. The method of claim 1, further comprising:
   forming a second dielectric layer over the conductive pad and over the back side of the wafer;
   forming a second opening in the second dielectric layer; and
   forming a second seed layer and a third metal within the second opening.

8. The method of claim 1, wherein a portion of the first dielectric layer is disposed between the first passivation layer and the first seed layer adjacent to the TSV.

9. A method of forming an integrated circuit structure, the method comprising:
   removing a portion of a wafer to expose a through-silicon-via (TSV) on a back side of the wafer;
   forming a first passivation layer over the exposed TSV and over the back side of the wafer;
   forming a first dielectric layer over the first passivation layer over the back side of the wafer, the first dielectric layer including a first opening that exposes a first portion of the first passivation layer over the TSV and a second portion of the first passivation layer in an area adjacent to the TSV;
   forming a first seed layer over the back side of the wafer and within the first opening over the exposed first and second portions of the first passivation layer;
   forming a first metal over the back side of the wafer and within the first opening over the first seed layer;
   planarizing the first metal, the first passivation layer, and the TSV to a top surface of the first dielectric layer and to expose a second metal of the TSV; and
   forming a conductive pad over the first metal and the TSV such that the conductive pad provides electrical connection between the second metal of the TSV and the first metal, the conductive pad including a second seed layer and a third metal,
   wherein the second seed layer is distinct from the first seed layer.

10. The method of claim 9, wherein the forming of the conductive pad includes:
    forming a second dielectric layer over the first metal and the TSV over the back side of the wafer;
    patterning and etching the second dielectric layer to create a second opening that exposes the first metal and the second metal of the TSV;
    forming the second seed layer within the second opening over the exposed first metal and the exposed second metal of the TSV; and
    electroplating the third metal over the second seed layer within the second opening.

11. The method of claim 9, further comprising:
    forming a second dielectric layer over the conductive pad and over the back side of the wafer;
    forming a second opening in the second dielectric layer; and
    forming a second seed layer and a third metal within the second opening.

12. The method of claim 9, wherein the first metal, the second metal, and the third metal each include at least one of: copper, tungsten, tantalum, or titanium.

13. The method of claim 9, wherein the forming the first passivation layer includes:
    forming an oxide layer and a nitride layer over the exposed TSV.

14. An integrated circuit structure having a front side and back side opposing the front side, the integrated circuit structure comprising:

a through-silicon-via (TSV) at least partially within a dielectric layer extending away from the front side;

a first metal adjacent to the TSV and within a first seed layer within the dielectric layer;

a second metal adjacent to the TSV on an opposing side of the TSV relative to the first metal, the second metal being within a second seed layer within the dielectric layer; and a conductive pad over the first metal, the second metal, and the TSV, and extending away from the front side, wherein the conductive pad provides electrical connection between the TSV, the second metal, and the first metal, and wherein the conductive pad includes a third metal within a third seed layer, wherein the third seed layer separates the third metal from the first metal the second metal, and the TSV.

15. The integrated circuit structure of claim 14, wherein the first seed layer and second seed layer are distinct from the third seed layer.

16. The integrated circuit structure of claim 14, wherein the first metal, the second metal, and the third metal each comprise at least one of: copper, tungsten, tantalum, or titanium.

17. The integrated circuit structure 14, further comprising:
a nitride passivation layer and an oxide passivation layer substantially surrounding the TSV such that the nitride passivation layer and the oxide layer are disposed between the TSV and the first seed layer.

18. The integrated circuit structure of claim 14, wherein a portion of the dielectric layer is disposed between the TSV and the first metal.

19. The integrated circuit structure of claim 14, wherein the TSV is approximately 5 microns thick.

20. The integrated circuit structure of claim 14, wherein the first metal and second metal each include a sloped sidewall.

* * * * *